United States Patent
Hasan et al.

(10) Patent No.: US 6,514,435 B1
(45) Date of Patent: Feb. 4, 2003

(54) HIGH DENSITY AND FAST PERSISTENT SPECTRAL HOLEBURNING IN II-VI COMPOUNDS FOR OPTICAL DATA STORAGE

(75) Inventors: Zameer Ul Hasan, Bensalem, PA (US); Veerendra Kumar Mathur, Beltsville, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/517,561

(22) Filed: Mar. 2, 2000

Related U.S. Application Data
(60) Provisional application No. 60/123,164, filed on Mar. 5, 1999.

(51) Int. Cl.[7] .............................. G02B 5/20; C09K 11/08; G11C 13/00
(52) U.S. Cl. ................ 252/584; 252/582; 252/301.4 R; 252/301.45; 365/114; 365/119
(58) Field of Search ................................. 252/582, 584, 252/301.4 R, 301.4 S; 365/114, 119

(56) References Cited

U.S. PATENT DOCUMENTS

| | | | |
|---|---|---|---|
| 3,896,420 A | | 7/1975 | Szabo |
| 4,101,976 A | | 7/1978 | Castro et al. |
| 4,947,465 A | * | 8/1990 | Mathur et al. ......... 252/301.4 S |
| 5,255,218 A | | 10/1993 | Yagyu et al. |
| 5,297,076 A | | 3/1994 | Jefferson et al. |
| 5,478,498 A | | 12/1995 | Kodama et al. |
| 5,585,640 A | * | 12/1996 | Huston et al. ........... 250/483.1 |
| 5,629,126 A | * | 5/1997 | Trutna, Jr. et al. ..... 252/301.4 S |
| 5,737,086 A | | 4/1998 | Gerber et al. |
| 5,746,991 A | | 5/1998 | Kubota |
| 5,811,822 A | * | 9/1998 | Huston et al. ........... 250/484.4 |
| 6,153,339 A | * | 11/2000 | Huston et al. .................. 430/1 |
| 6,211,526 B1 | * | 4/2001 | Huston et al. ........... 250/484.4 |

FOREIGN PATENT DOCUMENTS
WO 97/50132 * 12/1997

OTHER PUBLICATIONS

MacFarlane, et al., Cryst. Lattice Defects Amorphous Mater., vol. 12(1–4) pp. 417–26 (1985) (abstract only).*
Z. Hasan, M. Solonenko, P.I. Macfarlane, L. Biyikli, V.K. Mathur and F.A. Karwacki, "Persistent High Density Spectral Holeburning in CaS:Eu and CaS:Eu, Sm Phosphors," App. Phys. Letters, vol. 72, No. 19, pp 2373–2375 (May 11, 1998). Please Note: A copy of this document has been provided as "Appendix A" of the application.

(List continued on next page.)

Primary Examiner—Philip Tucker
(74) Attorney, Agent, or Firm—Howard Kaiser

(57) ABSTRACT

High density, photon-gated persistent spectral holeburning is effectuated in rare earth doped II–VI compounds such as MgS, CaS, BaS and SrS. Two-photon ionization of rare earth ions is performed, selected by a narrow band laser, producing narrow regions of reduced absorption (optical holes) in the absorption spectrum of a rare earth ion. These holes are useful for such applications as high density memory (especially, high density re-writable or photo-erasable memory), spectral holographic memory, communication, etc., and demonstrate great survivability over reading cycles, thermal cycles and elevated temperatures. The embedment of the rare earth doped II–VI compound in a matrix comprising a polymeric material (such as PMMA), prior to the effectuation of the holeburning, may be advantageous for many embodiments. Inventive practice has successfully burned two hundred forty photon gated spectral holes in the zero phonon line (ZPL) of the $4f–5d$ transition of $Eu^{2+}$ in a magnesium sulfide host. CaS:Eu, CaS:Eu,Sm and MgS:Eu are among the materials which have demonstrated a very high density of spectral holes.

8 Claims, 7 Drawing Sheets

OTHER PUBLICATIONS

Z. Hasan, L. Biyikli and P.I. Macfarlane, "Power–Gated Spectral Holeburning in an Unstable System (MgS:Eu2+, Eu3+): A Case for High Density Gated Holeburning," *App. Phys. Letters*, vol. 72, pp 3399–3401 (Jun. 29, 1998). Please Note: A copy of this document has been provided as "Appendix B" of the application.

Z. Hasan, "Material Challenges for Spectral Holeburning Memories," Invited Paper, *SPIE Proceedings on Adv. Opt. Mem. and Interfaces to Computer Storage*, eds: P. Mitkas and Z. Hasan, vol. 3468, pp 154–164 (Jul. 1998). Please Note: A copy of this document has been provided as "Appendix C" of the application.

L. Biyikli, M. Solonenko, S.M. Ahmedyan and Z. Hasan, "High Density Photon–Gated Hole Burning in Sulfides," *SPIE Proceedings on Adv. Opt. Mem. and Interfaces to Computer Storage*, eds: P. Mitkas and Z. Hasan, vol. 3468, pp 285–292 (Jul. 1998). Please Note: A copy of this document has been provided as "Appendix D" of the application.

Z. Hasan and L. Biyikli, "Photon–Gated Holeburning Materials: Directions in High Density Memory Storage," Materials Science Forum (1998), Invited Paper, vols. 315–317, pp 51–58 (1999). Please Note: A copy of this document has been provided as "Appendix E" of the application.

Z. Hasan, Narrow Bandgap Rare Earth Doped Materials: Challenges of Persistent Spectral Holeburning, presented on Mar. 6, 1996 at the Big Sky Workshop on the Applications of Persistent Spectral Holeburning, held in Big Sky, Montana, on Mar. 3–6, 1996 (14 pp). Please Note: A copy of this document has been provided as "Appendix F" of the application.

K. Chakrabarti, V.K. Mathur, Joanne F. Rhodes and R.J. Abbundi, "Stimulated Luminescence in Rare–Earth–Doped MgS," *J. Appl. Phys.*, vol. 64 (3), pp 1363–1366 (Aug. 1, 1988). Please Note: A copy of this document has been provided as "Appendix G" of the application.

V.K. Mathur and K. Chakrabarti, "Laser Discrimination by Stimulated Emission of a Phosphor," *NASA Conference Publication 3136*, vol. 1, pp. 476–484, presented at Technology 2001, The Second National Technology Transfer Conference and Exposition, Dec. 3–5, 1991, San Jose, California, Conference Proceedings Sponsored by NASA, the Technology Utilization Foundation and NASA Tech Briefs Magazine. Please Note: A copy of this document has been provided as "Appendix H" of the application.

L. Biyikli, Z. Hasan, "The Dynamics of Hole Burning in $4f^44f^{i-1}5d^1$ Transition of $Eu^{2+}$ in MgS," *Journal of Luminescence*, vols. 83–84, pp 373–377 (1999). Please Note: A copy of this document has been provided as "Appendix I" of the application.

S.M. Seyedahmadian, M.F. Aly, L. Biyikli, J.L. Park, M. Solonenko, Z. Hasan, "Inhomogeneous Broadening and Gated Hole Burning in MgS:Eu and CaS:Eu in Polymethylmethacralate (PMMA)," *Journal of Luminescence*, vols. 83–84, pp 389–392 (1999). Please Note: A copy of this document has been provided as "Appendix J" of the application.

T. Nishimura, E. Yagyu, M. Yoshimura, N. Tsukada and T. Takeyama, "Electric Field Effect on the Persistent Hole Burning of Quinone Derivatives," *SPIE Proceedings on Photochemistry and Photoelectrochemistry of Organic and Inorganic Molecular Thin Films*, eds: A. Frank, M.F. Lawrence, S. Ramesesha, C.C. Wamser, vol. 1436, pp 31–37 (1991).

H. Lin, T. Wang and T.W. Mossberg, "Demonstration of 8–Gbit/in.$^2$ Areal Storage Density Based on Swept–Carrier Frequency–Selective Optical Memory," *Optics Lett.* 20, pp 1658–1660 (Aug. 1, 1995).

X.A. Shen, E. Chiang and R. Kachru, "Time–Domain Holographic Image Storage," *Optics Lett.* 19, pp 1246–1248 (Aug. 15, 1994).

W.H. Kim, T. Reinot, J.M. Hayes and G.J. Small, "Hyperquenched Glassy Films of Water: A Study by Hole Burning," *J. Phys. Chem.* 99, No. 19, pp 7300–7310, (1995).

T. Reinot, W.H. Kim, J.M. Hayes and G.J. Small, "Electronic Dephasing of APT in Glasy Films of Water from 5 to 100 K: Implications for H–Bonding Liquids," *J. Chem. Phys.* 104: No. 3, pp 793–804 (1996).

T. Reinot, W. H. Kim, J.M. Hayes and G.J. Small, "New Standard for High–Temperature Persistent–Hole–Burining Molecular Materials: Aluminum Phthalocyanine Tetrasulphonate in Buffered Hyperquenched Glassy Films of Water," *J. Opt. Soc. Am. B* 14, pp 602–608 (Mar. 1997).

S.A. Basun, M. Raukas, U. Happek, A.A. Kapalyankskii, J.C. Vial, J. Rennie, W.M. Yen and R.S. Meltzer, "Off–Resonant Spectral Hole Burning in CaS:Eu by Time–Varying Coulomb Fields," *Phys. Rev. B* 56, pp 12992–12997 (1997).

"Two–Photon Absorbing Molecules Suggest Far–Reaching Applications, Scientists Report in Nature," Science Daily, Mar. 10, 1999, http://www.sciencedaily.com/releases/1999/03/990310054155.htm (Mar. 12, 1999), 3 pages.

"Two–Photon Absorbing Molecules Suggest Far–Reaching Applications, Scientists Report in Nature," University of Arizona Science and Research News, Mar. 4, 1999, http://science.opi.arizona.edu/lasso.acgi 2fcurrentdetails.htm&–recid=34318&–search (Mar. 12, 1999), 4 pages.

* cited by examiner

HIGH DENSITY AND FAST PERSISTENT SPECTRAL HOLEBURNING IN II–VI COMPOUNDS FOR OPTICAL DATA STORAGE

CROSS-REFERENCE TO RELATED APPLICATIONS

This application claims the benefit of U.S. provisional patent application no. 60/123,164, filed Mar. 5, 1999, hereby incorporated herein by reference, entitled "High Density and Fast Persistent Spectral Holeburning in II–VI Compounds for Optical Data Storage," joint inventors Veerendra Kumar Mathur and Zameer Ul Hasan.

This application is related to U.S. nonprovisional patent application no. 09/517,557, filed Mar. 2, 2000, hereby incorporated herein by reference, entitled "II–VI Compounds As a Medium for Optical Data Storage through Fast Persistent High Density Spectral Hole Burning," joint inventors Veerendra Kumar Mathur and Zameer Ul Hasan, which claims the benefit of the abovesaid U.S. provisional patent application no. 60/123,164, filed Mar. 5, 1999.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to memory storage of information, more particularly to materials, methods and apparatuses involving spectral holeburning for providing a medium for such storage.

The concept of using spectral holeburning for memory storage has been known since the discovery of the phenomenon in condensed matter.

"Spectral holes" are regions of reduced absorption (enhanced transparency) of the medium at discrete frequencies of the electromagnetic spectrum (visible light inclusive). Such holes can be created by a source of light such as a laser by selectively tuning the laser frequency to a predetermined value and impinging it on the medium of storage. This brings about changes at the atomic or molecular level altering the optical properties of a material (the medium of storage), only at the predetermined frequency. It is noted that spectral holes are not physical holes.

"Spectral hole-burning" is the process of creating or burning the spectral hole.

"Photon-gated hole-burning" is a special type of spectral hole-burning that takes place in the presence of two photons, whereas the holes can be read by one photon. It has the advantage that the process of reading the holes does not destroy the holes.

"Power-gated hole-burning" is a special type of photon-gated hole-burning where at higher powers the holes can be burned and can be read at a lower power that hardly affects them.

The potential of spectral holeburning based memory for high density storage has been demonstrated by using what is termed "transient spectral holeburning"; however, these systems would be classified as "volatile" storage systems.

"Transient" holeburning is significantly distinguishable from "persistent" holeburning. High density memory storage has been demonstrated by transient holeburning in rare earth doped materials. However, in cases of transient holeburning, if the memory is read, a constant refreshing of the memory (i.e., rewriting) is necessary. It is emphasized that "transient spectral hole burning" relates to "volatile memory," while "persistent spectral hole burning" relates to "storage memory."

Single photon persistent holeburning has been demonstrated but has had many disadvantages. Perhaps most notable among these disadvantages is the erasure of memory during the reading process.

The above-noted type of spectral holeburning known as "photon-gated holeburning" offers a solution to this problem. According to photon-gated holeburning, the holeburning takes place in the presence of two photons, while reading of these holes requires only one photon. Thus, according to photon-gated holeburning, the process of reading does not destroy the memory.

The multiplication factor by which the spectral holeburning can increase the storage density is determined by the maximum number of spectral holes that can be burned in an electronic transition. However, due to various material limitations, this number has not been large.

Szabo U.S. Pat. No. 3,896,420 issued Jul. 22, 1975, hereby incorporated herein by reference, discloses transient optical/spectral holeburning as a possible mechanism for memory storage.

Castro et al. U.S. Pat. No. 4,101,976 issued Jul. 18, 1978, hereby incorporated herein by reference, disclose a photon-gated holeburning method for creating persistent spectral holes which are not adversely affected by the reading process.

Other pertinent United States patents include the following, each of which is hereby incorporated herein by reference: Yagyu et al. U.S. Pat. No. 5,255,218 issued Oct. 19, 1993; Jefferson et al. U.S. Pat. No. 5,297,076 issued Mar. 22, 1994; Kodama et al. U.S. Pat. No. 5,478,498 issued Dec. 26, 1995; Gimzewski et al U.S. Pat. No. 5,588,886 issued Aug. 20, 1996; Kubota U.S. Pat. No. 5,746,991 issued May 5, 1998.

Other pertinent publications include the following, each of which is hereby incorporated herein by reference: T. Nishimura, E. Yagyu, M. Yoshimura, N. Tsukada and T. Takeyama, *SPIE Proceedings on Photochemistry and Photoelectrochemistry of Organic and Inorganic Molecular Thin Films*, eds: A. Frank, M. F. Lawrence, S. Ramesesha, C. C. Wamser, Vol. 1436, 31 (1991); H. Lin, T Wang and T. W. Mossberg, *Optics Lett.* 20 1658 (1995); X. A. Shen, E. Chiang and R. Kachru, *Optics Lett.* 19, 1246 (1994); W. H. Kim, T. Reinot, J. M. Hayes and G. J. Small, *J. Phys. Chem.* 99, 7300 (1995); T. Reinot, W. H. Kim, J. M. Hayes and G. J. Small, *J. Chem. Phys.* 104, 793 (1996); T. Reinot, W. H. Kim, J. M. Hayes and G. J. Small, *J. Opt. Soc. Am.* B 14, 602 (1997); S. A. Basun, M. Raukas, U. Happek, A. A. Kapalyanskii, J. C. Vial, J. Rennie, W. M. Yen and R. S. Meltzer, *Phys. Rev. B* 56, 12992 (1997).

SUMMARY OF THE INVENTION

In view of the foregoing, it is an object of the present invention to provide a medium for high density storage of information.

It is a further object of the present invention to provide a method for making a medium for high density storage of information.

It is another object of the present invention to provide such a method which uses fast holeburning.

Another object of the present invention is to provide a composition suitable for having holes burned therein in order to produce a medium for high density storage.

A further object of the present invention is to provide such a composition which is suitable for having holes burned rapidly therein.

The present invention is uniquely based on the application of the photon-gated holeburning process to II–VI materials doped with rare earth ions for achieving fast high density optical holeburning. According to the present invention, rare earth doped II–VI compounds are utilized for obtaining fast low power photon-gated high density rewritable memory. Persistent spectral holeburning is effectuated as the mechanism for information storage. Typical inventive practice prescribes a composition which has the following attributes: polycrystallinity; the presence of a host which is one or more narrow bandgap II–VI compounds; and, the presence of a dopant (with which the host is doped) which is one or more rare earth ions existing in at least two different valence states.

The designation "II–VI compound" is conventionally understood to refer to a compound which is the combination of a group (column) two ("II") element and a group six ("VI") element of the periodic table. Known group "IIA" elements are beryllium (Be), magnesium (Mg), calcium (Ca), strontium (Sr), barium (Ba) and radium (Ra). Known group "IIB" elements are zinc (Zn), cadmium (Cd) and mercury (Hg). Known group "VIA" elements are oxygen (O), sulfur (S), selenium (Se), tellurium (Te) and polonium (Po). With regard to the present invention, experimentation has primarily involved the II–VI compounds MgS, CaS, BaS and SrS. Beside the II–VI sulfides (II–VI compounds including the group six element sulfur), other II–VI compounds such as II–VI selenides (II–VI compounds including the group six element selenium) appear to be promising and are being investigated.

The known "rare earth elements," listed as follows, are conventionally understood to be those sixteen elements having an atomic number of 39 or between 57 and 71 inclusive: yttrium (Y, 39); lanthanum (La, atomic number 57); cerium (Ce, atomic number 58); praseodymium (Pr, atomic number 59); neodymium (Nd, atomic number 60); promethium (Pm, atomic number 61); samarium (Sm, atomic number 62); europium (Eu, atomic, number 63); gadolinium (Gd, atomic number 64); terbium (Tb, atomic number 65); dysprosium (Dy, atomic number 66); holmium (Ho, atomic number 67); erbium (Er, atomic number 68); thulium (Tm, atomic number 69); ytterbium (Yb, atomic number 70); lutetium (Lu, atomic number 71). With regard to the present invention, experimentation has primarily involved the rare earth element europium (Eu); other rare elements have also been tried, notably cerium (Ce), neodymium (Nd), samarium (Sm) and terbium (Tb).

According to many embodiments, the present invention provides a composition which is characterized by polycrystallinity and which comprises at least one II–VI compound and at least one rare earth element with which the at least one II–VI compound is doped. Typically, the at least one rare earth element includes at least two different valence states. Normally, the inventive composition is suitable for having a plurality of persistent spectral holes burned therein in order to produce a medium for high density storage.

The inventors have also considered and are investigating the possibility of inventively implementing transition metal ions other than rare earth ions. That is, an inventive composition (typically, characterized by polycrystallinity) can comprise at least one II–VI compound and at least one rare earth element with which the at least one II–VI compound is doped. Or, an inventive composition (typically, characterized by polycrystallinity) can comprise at least one II–VI compound and at least one transition metal element (instead of at least one rare earth element) with which the at least one II–VI compound is doped. Or, an inventive composition (typically, characterized by polycrystallinity) can comprise at least one II–VI compound and the combination of at least one rare earth element and at least one transition metal element, with which the at least one II–VI compound is doped; typical such embodiments would provide different valence states for the at least one transition metal element and the at least one rare earth element, e.g., a first valence state for a rare earth element and a second (different) valence state for a transition metal element.

In accordance with the present invention, variations of II–VI compounds and/or of the rare earth ions (and/or of the transition metal ions) can be used for covering different wavelength regions of the spectrum and/or for obtaining more promising characteristics pertaining to the phenomenon of holeburning and/or its applications.

Typically, according to this invention, the composition comprises two valence-valued rare earth atoms, viz., (i) a plurality of rare earth ions of a first valence state and (ii) a plurality of rare earth ions of a second valence state which differs from the first valence state. The II–VI compound/compounds is/are doped with (i) the rare earth ions of the first valence state and (ii) the rare earth ions of the second valence state. The rare earth ions are present so as to describe a ratio of the total rare earth ions of the first valence state to the total rare earth ions of the second valence state. According to typical inventive practice involving two different valence-valued rare earth atoms, the atoms of the higher-valued valence state are more numerous than are the atoms of the lower-valued valence state.

The present invention also provides a medium for information storage. The medium typically comprises a polycrystalline composition which includes at least one II–VI compound and at least one rare earth element with which the II–VI compound is doped. Typically, the rare earth element or elements is or are characterized by two different valence states. The composition has, burned therein, a plurality of persistent spectral holes.

The present invention also provides a method of making a medium suitable for information storage. The method of making such a medium typically comprises: providing a polycrystalline composition which includes at least one II–VI compound and at least one rare earth element with which said II–VI compound is doped; and, burning a plurality of persistent spectral holes in said composition. According to typical inventive practice, the rare earth element or elements is or are characterized by two different valence states, and the persistent spectral hole burning is or includes photon-gated persistent spectral holeburning.

Also provided by the present invention is a method of using a II–VI compound. The method of using a II–VI compound typically comprises: doping the II–VI compound with at least one rare earth element so as to form a polycrystalline composition, wherein the at least one rare earth element includes at least two different valence states; and burning a plurality of persistent spectral holes in the composition (typically, wherein photon-gated persistent spectral holeburning is effectuated).

The favorable characteristics of holeburning in accordance with the present invention are believed to be at least largely attributable to three inventive features, viz., (i) the polycrystallinity of the composition; (ii) the presence of two valence states of the rare earth atoms in the host; and, (iii) the suitable band gap of the II–VI host.

Generally according to this invention the composition is polycrystalline rather than single-crystalline in nature. Single crystals are very unlikely to demonstrate either the high density or the fast speed which are associated with polycrystals. Polycrystalline powders are capable of having the right concentration of electron traps, particularly the deep traps that make possible the high-density persistence and high speed of holeburning.

According to the present invention, the host can comprise one II–VI compound (e.g., CaS or MgS), or can comprise two or more II–VI compounds (e.g., CaS and MgS) which are mixed, stratified or otherwise combined. The host can be doped with one or more rare earth elements having one or more different valence states. For instance, MgS can be doped with a single rare earth element (e.g., Eu), or can be "co-doped" with two rare earth elements (e.g., Eu and Sm).

In typical inventive practice, the host is doped with rare earth atoms having two different valence states. The two different valence states can correspond to the same rare earth element (e.g., Eu2+ and Eu3+), or can correspond to two or more different rare earth elements (e.g., Eu2+ and Sm3+; or, Eu2+ and Sm2+ and Sm3+; or, Eu3+ and Sm2+ and Sm3+; or, Eu2+ and Eu3+ and Sm2+; or, Eu2+ and Eu3+ and Sm3+; or, Eu2+ and Eu3+ and Sm2+ and Sm3+).

The high density of the burned holes depends on the ratio of the respective numbers (totals or sums) of rare earth atoms, that is, in terms of how many rare earth atoms have the higher-numbered valence state versus how many rare earth atoms have the lower-numbered valence state. The speed of the holeburning also depends on the ratio of the presence of these two valence states. A "rule of thumb" for inventive practice, generally, is that the greater the ratio of the respective amounts of the two valence states, the greater the efficiency of the holeburning. In other words, the higher the ratio of these quantities, the better.

According to frequent inventive practice, the ratio of the number of atoms having the higher-numbered valence state to the number of atoms having the lower-numbered valence state will be greater than or equal to approximately 2 and less than or equal to approximately 10 (in other words, fall within the range between about two-to-one and ten-to-one). Ratios higher than ten or lower than two are possible in inventive practice. In general, a ratio of 10 is preferable to a ratio of 9, for instance, and a ratio of 11 is preferable to a ratio of 10.

The inventive medium can include one or more rare earth elements. Selection of the rare earth element or elements will typically be such as to accommodate the right ratio of the two valence states. The medium can comprise any II–VI compound or compounds, wherein the energies are adjusted in the suitable range of the spectrum.

In the case of Eu, for instance, according to typical inventive practice these two valence states are Eu2+ and Eu3+. The ratio of Eu3+ to Eu2+ in terms of prevalence of each is important. In inventive testing this ratio was increased to approximately ten or more (i.e., at least ten to one of Eu3+ to Eu2+). Since polycrystals were used, it was preferable for Eu3+ to be the dominant valence state. If single crystals were used instead of polycrystals, it would have been preferable to allow Eu2+ to be the dominant valance state. It is noted that, generally speaking, II–VI host materials are propitious insofar as allowing the 2+ valence state of the rare earth ion to be substituted therein.

The narrow band gaps of II–VI materials are particularly appropriate for the photoionization photon-gated holeburning made possible by red or IR lasers. This is a region of interest for commercial reasons; compact semiconductor lasers exist for communication purposes in the region of infra-red and approaching the red.

The present invention addresses certain key issues for the application of spectral holeburning technology, including the following: (i) the identification of the materials with high density of spectral holes; (ii) the demonstration of survivability of these holes over reading cycles; (iii) the demonstration of the stability of these holes under thermal cycling and at elevated temperatures; and, (iv) the demonstration of fast burning of holes using nano-second laser pulses.

Spectral holeburning has been known to have the potential for increasing the storage density by several orders of magnitude. Overcome by the present invention are some longstanding hurdles associated with persistent spectral holeburning. This invention combines stability and robustness of the memory with its high density of storage.

This invention is believed to demonstrate the highest number, to date, of persistent holes burned in any materials used. The inventors have burned two hundred forty (240) persistent photon-gated spectral holes in the zero phonon line (ZPL) of the $4f$–$5d$ transition of $Eu^{2+}$ in magnesium sulfide host. This is believed to represent the largest number of persistent photon-gated holes ever burned in any system. In principle, up to about a thousand (1,000) persistent photon-gated spectral holes or more can be burned in accordance with the present invention.

Among other advantages of the present invention, reading the inventively generated holes (memory) requires minimal power (microwatts or even nanowatts).

Another inventive advantage is fast writing and reading of the holes (data). Inventively generated holes were burned by a 10 nanosecond pulse. By comparison, typical burning times in rare earth for gated hole burning are in tens to hundreds of seconds.

Furthermore, the inventively generated holes are persistent and do not suffer any degradation after thousands of reading cycles.

Moreover, thermal cycling up to a temperature of 170 degrees K has little effect on the inventively generated holes.

In addition, the inventively generated holes are quickly erasable (typically, in a range between a few tenths of seconds and hundredths of seconds) by slightly shifting the energy of the laser beam. This photo-erasability has favorable implications for multiple-write memory.

In contrast to the systems according to the present invention, current transient holeburning systems work at or close to 4.2 degrees K. Generally in accordance with these known transient holeburning systems, the memory is lost by any surge in temperature around 10 degrees K or higher; the memory is temporary. The memory is erased eventually within the course of (at most) a day, even at 2 degrees K and when the system is unused. The memory is erased in the process of reading it.

The photon-gated systems of the past afforded various benefits. They were long-lived, and the memory in them was immune to reading. However, the low density of the holes and long burning times rendered these photon-gated systems of little commercial significance. In most cases, a rewriting requires heating the sample from the cryogenic temperatures up to the room temperature in order to erase the memory quickly.

Among the potential commercial uses of the present invention are the following: high density optical memory; time domain; frequency domain; hybrids of time and frequency domain storage; page oriented spectral holographic memory; quantum computing; spectral holographic storage; petaflop computing.

It is believed that the present invention, which provides persistent holeburning materials and systems pertaining thereto which are characterized by high densities of holes, has potential commercial value. Other persistent holeburning materials and systems pertaining thereto are characterized by low densities of holes; if and to the extent that they have been explored, they are believed in general to lack real commercial value.

Other objects, advantages and features of this invention will become apparent from the following detailed description of the invention when considered in conjunction with the accompanying drawings.

BRIEF DESCRIPTION OF THE DRAWINGS

In order that the present invention may be clearly understood, it will now be described by way of example, with reference to the accompanying drawings, wherein like numbers indicate the same or similar components, and wherein:

FIG. 2(a) shows that $\Gamma_{inh}$, the width of the inhomogeneous line, was increased by about fifty percent (i.e., a factor of about 1.5).

BRIEF DESCRIPTION OF THE APPENDICES (a) Z. Hasan, M. Solonenko, P. I. Macfarlane, L. Biyikli, V. K. Mathur and F. A. Karwacki, "Persistent High Density Spectral Holeburning in CaS:Eu and CaS:Eu,Sm Phosphors," *Applied Physics Letters*, vol. 72, no. 19, pp 2373–2375 (May 11, 1998);

(b) Z. Hasan, L. Biyikli and P. I. Macfarlane, "Power-Gated Spectral Holeburning in an Unstable System (MgS:Eu2+, Eu3+): A Case for High Density Gated Holeburning," *Applied Physics Letters*, vol. 72, no. 26, pp 3399–3401 (Jun. 29, 1998);

(c) Z. Hasan, "Material Challenges for Spectral Holeburning Memories," Invited Paper, *SPIE Proceedings on Advanced Optical* Memory and Interfaces to Computer Storage, eds: P. Mitkas and Z. Hasan, vol. 3468, pp 154–164 (July 1998);

(d) L. Biyikli, M. Solonenko, S. M. Ahmedyan and Z. Hasan, "High Density Photon-Gated Hole Burning in Sulfides," *SPIE Proceedings on Advanced Optical Memory and Interfaces to Computer Storage*, eds: P. Mitkas and Z. Hasan, vol. 3468, pp 285–292 (July 1998);

(e) Z. Hasan and L. Biyikli, "Photon-Gated Holeburning Materials: Directions in High Density Memory Storage,." Materials Science Forum (1998), Invited Paper, vols. 315–317, pp 51–58 (1999);

(f) Z. Hasan, "Narrow Bandgap Rare Earth Doped Materials: Challenges of Persistent Spectral Holeburning," fourteen pages, presented by joint inventor Hasan on Mar. 6, 1996 at the Big Sky Workshop on the Applications of Persistent Spectral Holeburning, held in Big Sky, Mont., on Mar. 3–6, 1996;

(g) K. Chakrabarti, V. K. Mathur, Joanne F. Rhodes and R. J. Abbundi, "Stimulated Luminescence in Rare-Earth-Doped MgS," *Journal of Applied Physics*, vol. 64, no. 3, pp 1363–1366 (Aug. 1, 1988);

(h) V. K. Mathur and K. Chakrabarti, "Laser Discrimination by Stimulated Emission of a Phosphor," *NASA Conference Publication* 3136, vol. 1, pp 476–484, presented at Technology 2001, The Second National Technology Transfer Conference and Exposition, Dec. 3–5, 1991, San Jose, Calif., Conference Proceedings Sponsored by NASA, the Technology Utilization Foundation and NASA Tech Briefs Magazine;

(i) L. Biyikli, Z. Hasan, "The Dynamics of Hole Burning in $4f^n-4f^{n-1}5d^1$ Transition of Eu$^{2+}$ in MgS," *Journal of Luminescence*, vols. 83–84, pp 373–377 (1999);

(j) S. M. Seyedahmadian, M. F. Aly, L. Biyikli, J. L. Park, M. Solonenko, Z. Hasan, "Imhomogeneous Broadening and Gated Hole Burning in MgS:Eu and CaS:Eu in Polymethylmethacralate (PMMA)," *Journal of Luminescence*, vols. 83–84, pp 389–392 (1999).

DETAILED DESCRIPTION OF THE INVENTION

Figure 1:
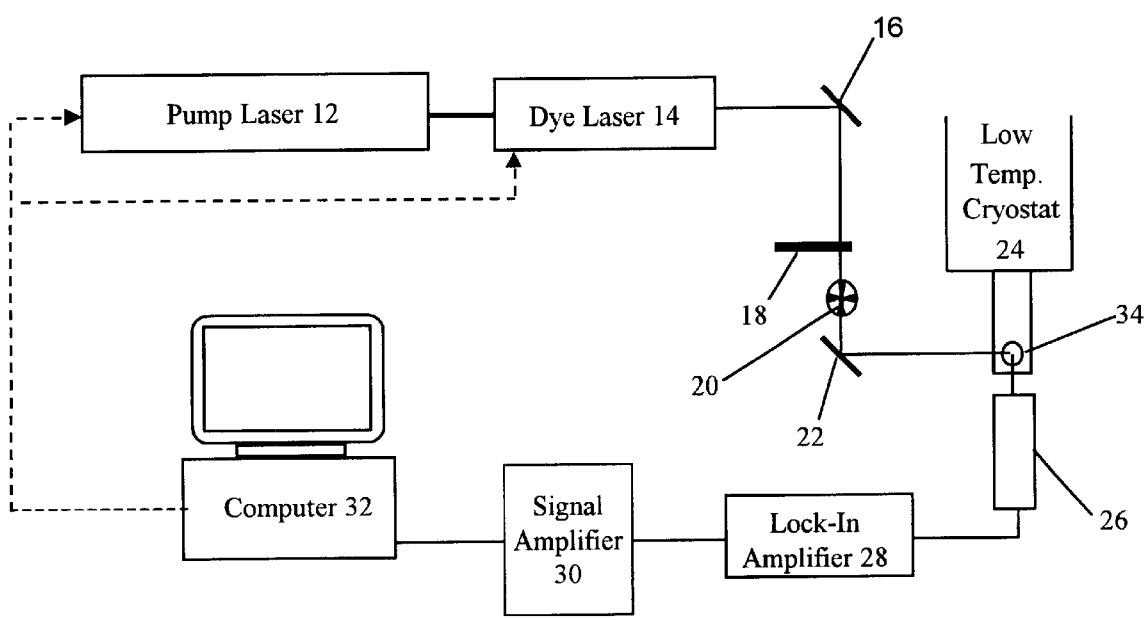
FIG. 1 is a schematic representation of an experimental system for effectuating photon-gated holeburning, in accordance with an experimentally practiced embodiment of the present invention.

Reference is now made to FIG. 1, which is a block diagram of the experimental set-up which was used for photon-gated holeburning (burning and reading holes) in accordance with the present invention. In FIG. 1, the dashed lines illustrate the computer control of the lasers used.

Inventive photon-gated holeburning system 10 included pump laser 12, dye laser 14, mirror 16, shutter 18, mechanical light beam chopper 20, mirror 22, low temperature cryostat 24, detector 26, lock-in amplifier 28, signal amplifier 30 and computer (processor/controller) 32.

The laser system comprised two lasers, viz., pump laser 12 and dye laser 14. Pump laser 12 was used to "pump" (optically excite) dye laser 14, which narrowed the bandwidth (linewidth) of the electromagnetic radiation received from pump laser 12.

For slow burning, in inventive practice pump laser 12 can be an ion laser such as an argon ion (Ar-ion) laser. A Coherent model Innova Ar-ion laser was implemented as pump laser 12. The dye laser 14 which was used for slow burning was a Coherent model 899-29. The home-made electromagnetic shutter 18 was used for burning the holes with a strong pump laser 12 beam. For reading the holes, a weaker dye laser 14 beam, chopped by mechanical light beam chopper 20 for phase-sensitive detection, was utilized.

For fast burning, the pump laser 12 which was implemented was a Lamda Physik excimer laser, model-Compex 110 (using a Xe-Cl mixture). For fast burning, the dye laser 14 which was experimentally implemented was a Lamda Physik laser, model LPD 3000 (using an R6G dye laser).

The low temperature cryostat 24 used was either of two cryostat models, depending on the temperature of operation. For temperatures at or above 10 K, a closed cycle refrigerator APD Cryogenics, model Displex DE-202, was used. For temperatures below 10 K, a liquid helium immersion cryostat, Cryo Industries model CIOCC-200-2-R, was used.

The detector 26 which was used included a photomultiplier tube, model Thorn-EMI 9816B, in conjunction with a low noise current preamplifier, Stanford Research model 570.

The phase-sensitive detection system included a lock-in amplifier 28 (Stanford Research model 830) and a signal amplifier 30 (Stanford Research model 540). Computer 32, which included an IBM PC computer with a Pentium processor, was used for controlling the lasers as well as accumulating and processing the holeburning data.

The preparation of rare earth doped alkaline earth sulfide samples 34 was performed in two basic steps or stages, as described in the following two paragraphs.

Step one: The desired sulfide, CaS or MgS, was prepared by heating $CaSO_4$ or anhydrous $MgSO_4$ at 1,150° C. in a reducing atmosphere of $CS_2$. This was done in a quartz tube furnace with a typical heating time of seven hours. A mixture of Argon as a buffer gas, and $CS_2$ as the reactive gas, flowing through the furnace, provided the reducing atmosphere surrounding the sample. This gas mixture was prepared by passing Ar-gas through 50 c.c. liquid $CS_2$ in a glass tube with a rate of two bubbles per second. This was also the flow rate of the gas mixture through the furnace.

Step two: The sulfide prepared in step one was mixed with the rare earth oxide $Eu_2O_3$ in a fixed mass ratio to provide a 0.01 molar percentage of Eu. This mixture was fired under exactly the same conditions as in step (1) to incorporate rare earth ions by high temperature diffusion. The sample thus obtained was in the form of micro-particles of sulfides. The micro-particles of polycrystalline powder were a few tens of microns in size.

The sulfide micro-particles thus obtained were polycrystalline rather than single crystal. In each of steps one and two, the heating was performed at about 1,150 degrees C for a period of about seven hours. Generally speaking, in order to obtain suitable polycrystalline samples, inventive practice would prescribe that the heating in step one (sulfide preparation) and in step two (rare earth ion incorporation via high temperature diffusion) must each be sustained for a period of sufficient duration and at a sufficiently high temperature for (i) complete reduction of sulfate to sulfide and (ii) proper incorporation of Eu ion into the crystal lattice. In terms of minimum temperatures and durations, as a general rule for inventive practice of composition preparation, the heating in each of steps one and two will be performed at about 700 degrees C or greater for a period of about two hours or greater.

The polycrystalline nature of the composition is a significant aspect of the present invention. Methodologies for producing single crystal compounds, as well as for producing polycrystalline compounds, are known in the art. Generally, it is easier to make a polycrystalline compound than it is to make a single crystal compound. Single crystals are difficult to prepare at any temperature, especially at low temperatures.

Take, for example, some inventive embodiments involving europium as rare earth element, specifically wherein Eu2+ and Eu3+ are both present. The ratio of Eu3+ to Eu2+ is a crucial factor. In the inventive test samples the ratio of Eu3+ to Eu2+ was approximately equal to ten-to-one. Inventive practice implementing polycrystals preferably prescribes that the higher-numbered valence state (in this case, Eu3+) is the dominant valence state, typically in a ratio (in this case, the ratio of Eu3+ to Eu2+) of at least two and as high as ten or even greater. On the other hand, if single crystals were used, it would be preferable that the lower-numbered valence state (in this case, Eu2+) would be the dominant valence state.

The polycrystalline nature of the composition, by virtue of allowing a greater fraction of Eu3+, is significantly responsible for the broad lines. There are other factors which relate to the broadness of the lines. For instance, f-d transitions are usually broad and hence permit large numbers of narrow holes to burned in them. The f-d transitions are strong, and therefore spectral holes can be burned in them relatively easily.

Polycrystalline materials are thus believed to be more suitable than single crystals for practicing persistent hole burning in accordance with the present invention. Due to the preponderance of lattice vacancies in polycrystalline phase, both $Eu^{2+}$ and $Eu^{3+}$ can be easily incorporated in the lattice. In the polycrystalline material case, vacancies may provide one way of charge compensation for the incorporation of $Eu^{3+}$. A persistent hole is provided by the ionization of an $Eu^{2+}$ ion, when the free electron is trapped at an $Eu^{3+}$ ion. The inventors believe that sufficiently large concentration of $Eu^{3+}$ is required to burn holes at lower powers and in shorter periods of time.

It is thus believed by the inventors that the polycrystalline nature of the rare earth-doped II–VI compound contributes to the advantageous nature of the present invention; in particular, single crystal samples of same or similar composition will not perform as propitiously as the polycrystalline samples according to this invention.

The aforementioned paper S. A. Basun et al., entitled "Off-Resonant Spectral Hole Burning in CaS:Eu by Time-Varying Coulomb Fields," *Phys. Rev.* B 56, 12992 (1997), discloses the photon-gated persistent spectral holeburning of a solitary hole in a single-crystalline Eu doped calcium sulfide material. Notably, Basun et al. succeeded in burning only one hole. Moreover, the single crystals of Basun et al. were observed to have unwanted additional sites of $Eu^{2+}$ which were associated with defects; by contrast, no such defect sites have been observed in the samples of the present invention. Furthermore, Basun et al. do not disclose that they produced either a high density or a fast storage; nor do Basun et al. even remotely suggest the production of either such effect.

Multiple holes were burned in the ZPL (zero phonon line) of sample 34 with a pumped dye laser 14 beam of power 25 W/cm$^2$, unfocused and 200 micron in diameter. Clearly readable holes were burned in the entire 6 THz range, including the farthest wings. The pumped dye laser 14 read beam in the second wing had a power of 60 microwatts per square centimeter and the same beam diameter as above. Reduced power was achieved by using the neutral density filters in association with dye laser 14. The data was read using fluorescence excitation technique with a wave-meter controlled Coherent 899-29 Ti dye laser 14 as the source of excitation. The scattered laser light was filtered from reaching the photo-multiplier tube of detector 26 by using Mellis-Griot Company 590 nm cut-off and interference filters.

The present invention provides high density spectral holeburning in rare earth doped II–VI compounds. The inventive method involves one and two-photon ionization of rare earth ions, selected by a narrow band laser, in MgS, CaS, BaS, SrS and other II–VI compounds.

This invention produces narrow regions of reduced absorption, known as "optical holes" or "spectral holes," in the absorption spectrum of a rare earth ion. These holes can be used in applications such as high density memory, communications, etc. Each hole represents a bit of memory.

In accordance with the present invention, a large number of spectral holes can be burned at the same physical location by tuning the frequency of the laser used for the spectral holeburning. The storage capacity of such a system, compared to the ordinary optical storage material, is multiplied by the number of holes that can be burned in the energy spectrum of the material.

In inventive principle, this number of persistent holes can vary from a thousand to a million or even more, thus increasing the storage density by a thousand fold to a million fold. The potential achievability of such high storage densities (high densities for permanent holes) by using spectral holeburning has been recognized, in theory. Previous to the present invention, such high storage densities have been theoretically possible but practically impossible. This invention solves some serious material problems which are traditionally associated with spectral holeburning.

The present invention provides optical storage using a new class of materials for the spectral hole-burning based memories. Using spectral hole-burning, multiple bits of memory can be stored in the same area (in applications involving two dimensional storage) or the same volume (in applications involving three dimensional storage), as used for a single bit of memory in current storage techniques.

According to this invention, a new class of materials, with a suitable choice of impurities in them, and appropriate processing, can be used for high density and fast storage of information. The class of materials is II–VI compounds and their alloys. The impurities are rare earth ions, transition metal ions, color centers, and other defects in solids. The inventive processing of material includes treatments and preparation routes which enhance the information storage and retrieval characteristics of the medium. Such characteristics include the following:

1. High Density of Spectral Holes: Every spectral hole is a "bit" of memory. The number of spectral holes that can be burned in a single spot is the number of bits stored there. The larger the number of spectral holes, the greater is the density of storage.
2. Fast Burning and Reading of Spectral Holes: Burning is the writing process, and reading is the retrieval of the written information. Both of these processes need to be fast.
3. Nondestructive Reading: The process of reading the spectral holes should not affect the spectral holes.
4. Survival of the Spectral Holes at High Temperatures: To date spectral hole-burning based memories work at low temperatures. Upon raising the temperature of the medium, the spectral holes can be erased. A medium that allows for higher operational temperature is a better medium.
5. Thermal Cycling of Holes: To safeguard the memory against any accidental surge in temperature the spectral holes should at least survive a short term increase in the temperature of the storage device.
6. Fast Erasure of Spectral Holes: For a re-writable medium it is essential that the memory (spectral holes) can be erased quickly.
7. Survival of the Spectral Holes Over a Long Time Period: Ideally the spectral holes should be permanent and should not deteriorate with time.
8. Suitability and Compatibility as a Device for Storage and Other Applications: Fabrication of two dimensional and three dimensional large size samples of the material is an important aspect for different applications.

The inventors have observed and reported high density and fast, photon-gated and power-gated hole-burnings in MgS doped with Europium, and in CaS doped with Europium. Regarding MgS doped with Europium, see the following aforementioned references, each of which is incorporated herein by reference: Z. Hasan et al., "Power-Gated Spectral Holeburning in an Unstable System (MgS:Eu2+, Eu3+): A Case for High Density Gated Holeburning"; L. Biyikli et al., "High Density Photon-Gated Hole Burning in Sulfides"; Z. Hasan, "Material Challenges for Spectral Holeburning Memories"; Z. Hasan et al., "Photon-Gated Holeburning Materials: Directions in High Density Memory Storage"; L. Biyikli et al., "The Dynamics of Hole Burning in $4f^n$–$4f^{n-1}5d^1$ Transition of $Eu^{2+}$ in MgS"; S. M. Seyedahmadian et al., "Imhomogeneous Broadening and Gated Hole Burning in MgS:Eu and CaS:Eu in Polymethylmethacralate (PMMA)." Regarding CaS doped with Europium, see the following aforementioned references, each of which is incorporated herein by reference: Z. Hasan et al. "Persistent High Density Spectral Holeburning in CaS:Eu and CaS:Eu,Sm Phosphors"; L. Biyikli et al., "High Density Photon-Gated Hole Burning in Sulfides"; S. M. Seyedahmadian, M. F. Aly, L. Biyikli, J. L. Park, M. Solonenko, Z. Hasan, "Imhomogeneous Broadening and Gated Hole Burning in MgS:Eu and CaS:Eu in Polymethylmethacralate (PMMA)."

Described hereinbelow are highlights of inventive achievements to date. These highlights are ordered generally in accordance with the favorable characteristics of a storage medium which are described hereinabove and denoted characteristics "1" through "8." Also notable is the fact that, according to this invention, all of these favorable characteristics are combined in one material.

I. High Density of Spectral Holes

As disclosed in Z. Hasan et al., "Power-Gated Spectral Holeburning in an Unstable System (MgS:Eu2+, Eu3+): A Case for High Density Gated Holeburning," the inventors have burned 240 power gated holes in MgS: Eu. These holes have been burned in the purely electronic absorption line of the 4f–5d transition of Europium. A broader absorption line implies that a larger number of holes can be burned in it. The line width has been broadened by embedding the micron size particles in different hosts.

Figure 2:
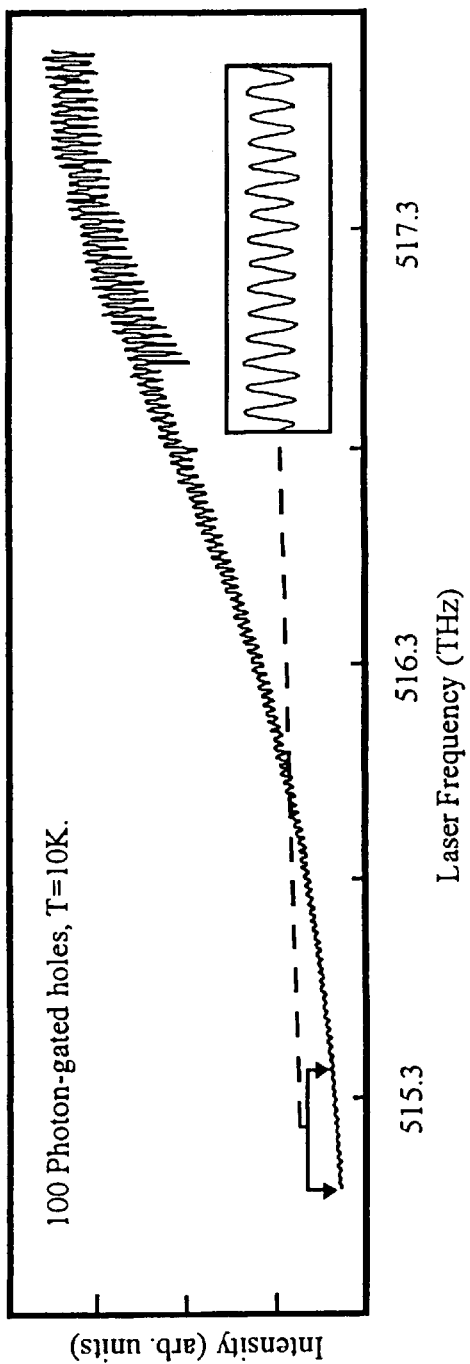
FIG. 2 is a graphical representation of inventive practice wherein one hundred persistent holes were burned in a small segment of the ZPL (zero phonon line) of MgS:Eu in polymethylmethacralate (PMMA) at 578 nm, burn beam intensity 25 W/cm$^2$, read beam intensity 60 $\mu$W/cm$^2$. The temperature of the holeburning was 10 K (T=10 K). The inset, a partial and enlarged view, shows the excellent signal to noise ratio of the holeburning spectrum.
Figure 2A:
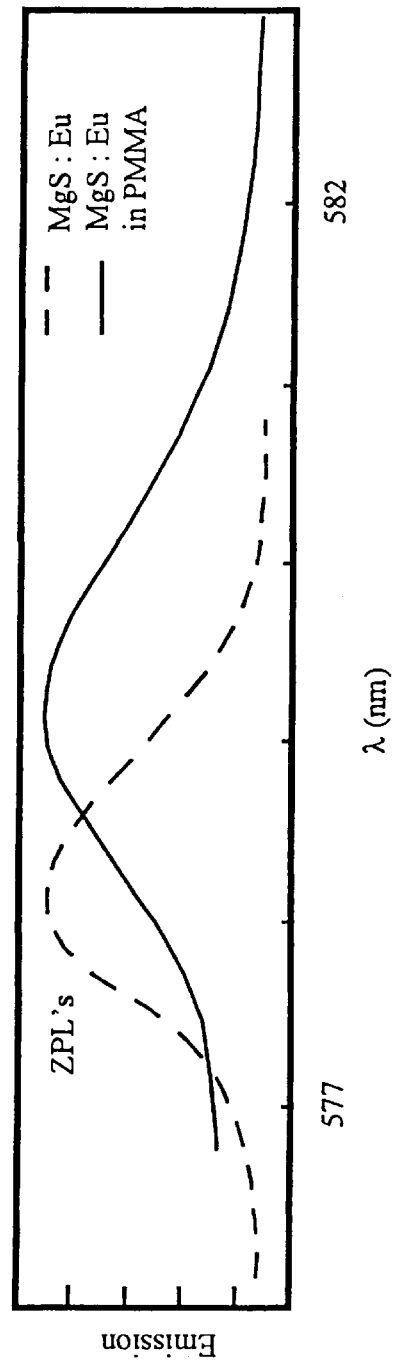
FIG. 2(a) is a graphical representation, associated with FIG. 2, comparing the ZPL's with and without PMMA.

Results pertaining to such broadening and holeburning in MgS:Eu embedded in Polymethyl Methacrylate (abbreviated "PMMA") are disclosed in: Z. Hasan, "Material Challenges for Spectral Holeburning Memories"; Z. Hasan et al., "Photon-Gated Holeburning Materials: Directions in High Density Memory Storage"; S. M. Seyedahmadian et al., "Imhomogeneous Broadening and Gated Hole Burning in MgS:Eu and CaS:Eu in Polymethylmethacralate (PMMA)." Reference is now made to FIG. 2 and FIG. 2(a), which illustrate propitious inventive practice involving PMMA. The graphical representations of FIG. 2 and FIG. 2(a) are also presented in Z. Hasan, "Material Challenges for Spectral Holeburning Memories," FIG. 6; see also, Z. Hasan et al., "Photon-Gated Holeburning Materials: Directions in High Density Memory Storage," FIG. 6.

As demonstrated in FIG. 2 and FIG. 2(a), for many inventive embodiments it may be advantageous to effect embedment of the rare earth doped II–VI compound in a matrix comprising (e.g., constituting or substantially constituting) PMMA or another polymeric material, prior to the performance of the spectral holeburning. By the inventive procedure wherein MgS:Eu is embedded in PMMA, the line width is broadened by a factor of 1.5. Such broadening allows for a large number of holes to be burned, thus increasing the density of spectral holes. Other advantages of using a PMMA matrix (or another appropriate polymeric matrix) are: the transparency of the PMMA matrix in the visible region of the spectrum so that it does not affect the process of burning or reading the holes; and, the ease of forming two or three dimensional storage medium by such a polymer.

In a small segment of the absorption line, one hundred spectral holes were burned in a PMMA embedded sample, thus demonstrating the high density of the holes resulting from inventive practice involving PMMA. By adjusting the separation between the spectral holes, up to 566 spectral holes can be burned using a polymer such as PMMA in accordance with the present invention.

In accordance with the present invention, this number (566) of spectral holes can be increased to 1,000 or even higher by doing one or more of the following: (i) using a single isotope of Eu in this host; (ii) changing to a host material (or host materials) other than MgS; (iii) alloying the material or introducing other impurities; (iv) choosing another rare earth ion (or other rare earth ions); and, (v) increasing the width of the electronic transition by chemical or physical modification of the material. In this manner, either narrow holes, or broad lines where these holes are burned, or both, can be achieved. This would result in a higher density of spectral holes. In this regard, work by the inventors is in progress.

Spectral holes can provide frequency-selective multiple usage of a single spatial location to store information, thus introducing another dimension to the memory storage, viz., the frequency domain. Ideally, the improvement in storage density is given by the ratio $\Gamma_{inh}/\Gamma_{hol}$, where $\Gamma_{inh}$ is the width of the inhomogeneous line, and $\Gamma_{hol}$ is the width of the spectral hole.

Figure 3:
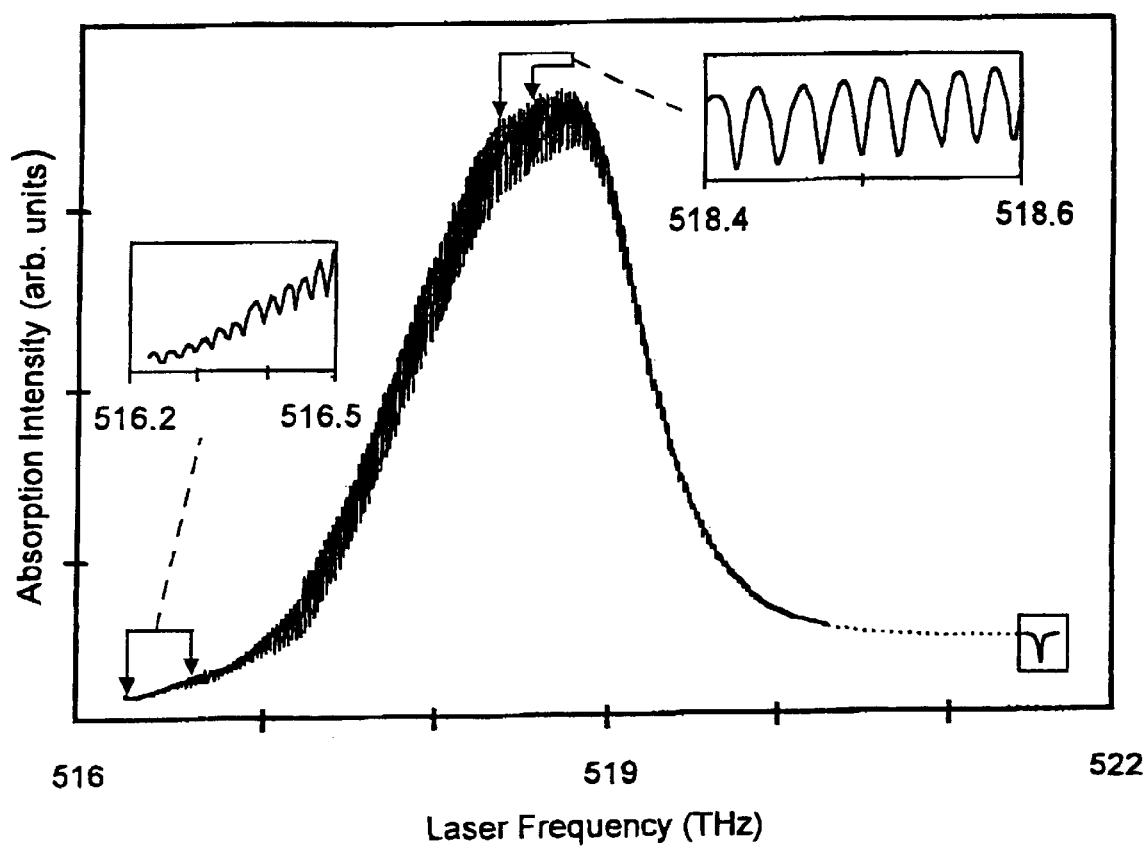
FIG. 3 is a graphical representation of inventive practice wherein two hundred forty persistent holes were burned in the ZPL (zero phonon line) of MgS:Eu at 578 nm, burn beam intensity 25 W/cm$^2$, read beam intensity 60 $\mu$W/cm$^2$. The insets show the details of holes burned 25 GHz apart. The temperature of the holeburning was 2 K (T=2 K).

With reference to FIG. 3, this graph is disclosed in FIG. 2 of Z. Hasan et al., "Power-Gated Spectral Holeburning in an Unstable System (MgS:Eu2+,Eu3+): A Case for High Density Gated Holeburning," and illustrates the possibility of high density holeburning according to this invention. FIG. 3 shows multiple holes burned in the ZPL at 578 nm with an unfocused laser beam of 25 W/cm². Clearly readable holes were burned in the entire 6 THz range up to the farthest wings of the ZPL.

Insets in FIG. 3 show the details of the holeburning pattern on an expanded scale. The burning time for each hole was 2 s, the separation between the holes was 25 GHz, and typical holewidths were $\Gamma_{hol}$~8 GHz. For short exposure times, narrower holes, $\Gamma_{hol}$=6 GHz, were burned. The persistence of these holes was confirmed by burning a hole and reading it after 29 h. The temperature in that period was kept ≦170 K.

More recently, the hole width $\Gamma_{hol}$, has been reduced by the inventors to less than 2 GHz with 5 GHz separation. It has thus been demonstrated, in accordance with the present invention, that more than 1,000 holes can be burned in a broad line spanning a 6 THz range.

Figure 4:
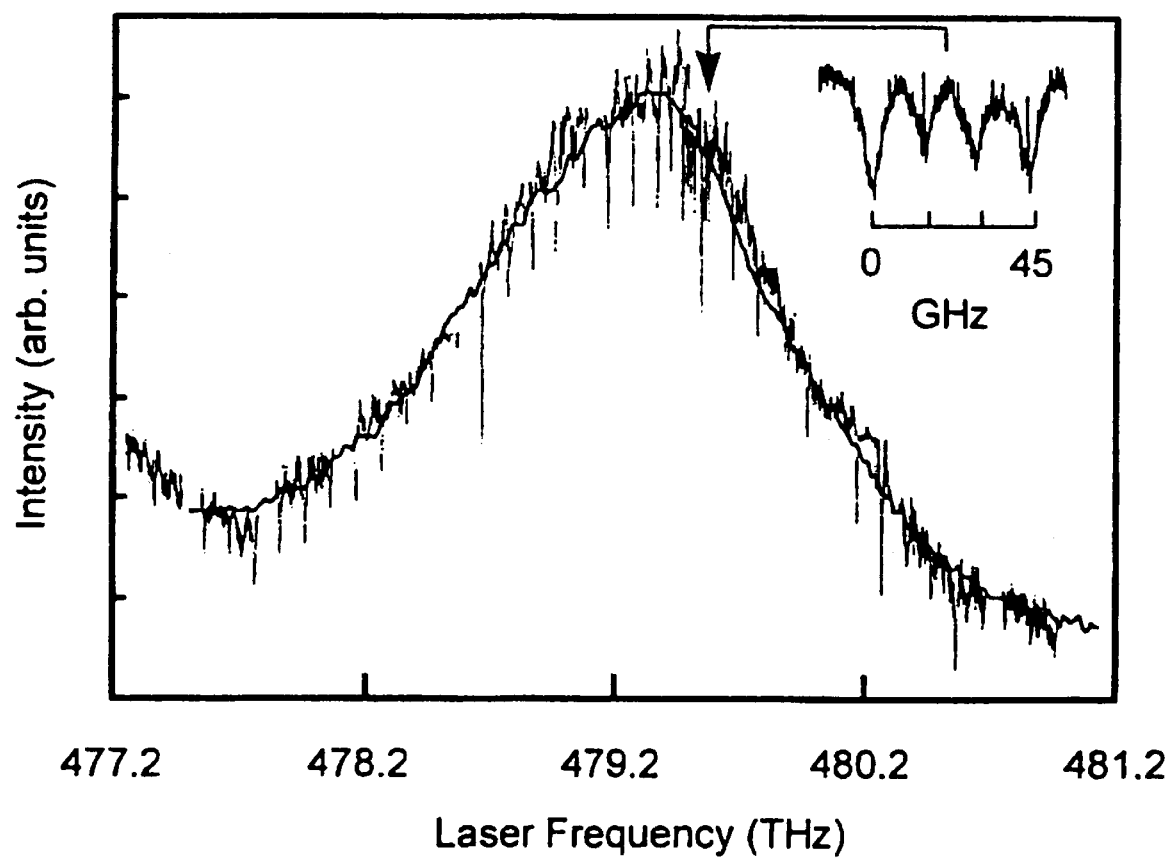
FIG. 4 is a graphical representation of inventive practice wherein multiple photon-gated holes were burned in the ZPL (zero phonon line) of CaS:Eu at 625 nm, sharp vertical lines. Holes were burned in the groups of 3–4, 30 GHz apart, and then read. The inset shows on expanded scale the region where holes were burned 15 GHz apart. The solid line is to aid the visualization of the ZPL. The temperature of the holeburning was 2 K (T=2 K).

With reference to FIG. 4, this graph is disclosed in FIG. 3 of Z. Hasan et al., "Persistent High Density Spectral Holeburning in CaS:Eu and CaS:Eu,Sm Phosphors," and also illustrates the possibility of high density holeburning according to the present invention. FIG. 4 shows a large number of holes burned at 2 K across the inhomogeneously broadened ZPL of CaS:Eu. The holes were burned with a power of 24 mW/cm² from a dye laser and the tungsten lamp focus on the sample. A high pass glass filter (RG 75) was used to block lamp radiation with λ<675 nm from reaching the sample. These persistent holes were burned in groups of three to four, 30 GHz apart, and read immediately after.

Still with reference to FIG. 4, in order to determine the minimum separation possible between the holes, four holes were burned 15 GHz apart. The four holes are shown in the inset of FIG. 4. It can be seen from FIG. 4 that the total range where such holes can be burned is ~4,000 GHz. With holes only 15 GHz apart, in excess of 250 holes can be burned in a single inhomogeneous line.

II. Fast Burning and Reading of Spectral Holes

Figure 5:
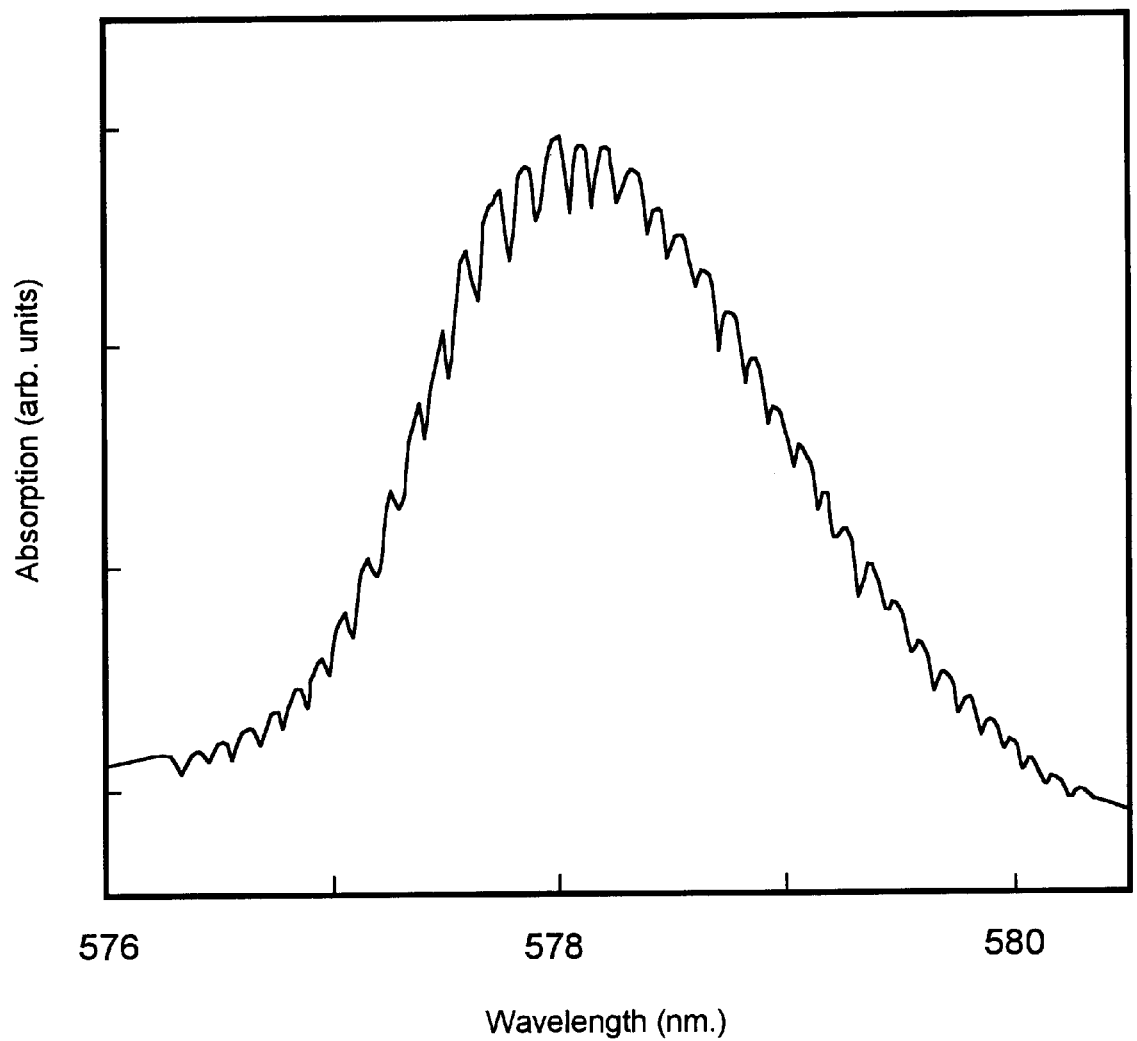
FIG. 5 is a graphical representation of inventive practice wherein forty persistent photon-gated holes were burned in the ZPL (zero phonon line) of MgS:Eu using a 10 nanosecond laser pulse (from an excimer pumped dye laser) for each. The temperature of the holeburning was 10 K (T=10 K).

With reference to FIG. 5, this graphically displayed data on fast holeburning is disclosed in FIG. 8 of Z. Hasan, "Material Challenges for Spectral Holeburning Memories." As disclosed in Z. Hasan, "Material Challenges for Spectral Holeburning Memories," multiple spectral holes were burned using a 10 nanosecond laser pulse per hole. This corresponds to a writing speed of 100 megabits of memory per second.

FIG. 5 demonstrates the possible fast burning in II–VI materials doped with rare earth ions. FIG. 5 is a graphical representation of forty persistent photon-gated holes burned in the ZPL of MgS:Eu. The holeburning was performed using a single laser pulse for each hole. These pulses were provided by an excimer pumped dye laser and were of 10 nano-seconds duration. The temperature of the sample was kept at 10 K.

Similar results were obtained in the case of CaS:Eu, such as illustrated in FIG. 4. In FIG. 4, the Eu is incorporated in MgS; in FIG. 5, by contrast, the Eu is incorporated in another II–VI compound, viz., CaS. It is noted that FIG. 2, FIG. 3, FIG. 5, FIG. 6 and FIG. 7 herein pertain to holeburning in MgS:Eu, whereas FIG. 4 herein pertains to holeburning in CaS:Eu.

The inventive system is capable of faster burning than that disclosed in Z. Hasan, "Material Challenges for Spectral Holeburning Memories." The present limit is a manifestation of the limitation of the short pulses from the inventors' laser. Work by the inventors is in progress to demonstrate the fast limit on spectral hole-burning in the inventive systems. Nevertheless, the speed disclosed in Z. Hasan, "Material Challenges for Spectral Holeburning Memories," is six to seven orders of magnitude faster than that observed by others using similar techniques.

III. Nondestructive Reading

In accordance with the present invention, the spectral holes in MgS:Eu can be read without being affected by the read cycle. It is demonstrated in FIG. 3 of Z. Hasan et al., "Power-Gated Spectral Holeburning in an Unstable System (MgS:Eu2+,Eu3+): A Case for High Density Gated Holeburning," and FIG. 7 of Z. Hasan, "Material Challenges for Spectral Holeburning Memories," that upon reading two thousand times the holes are not affected at all.

Figure 6:
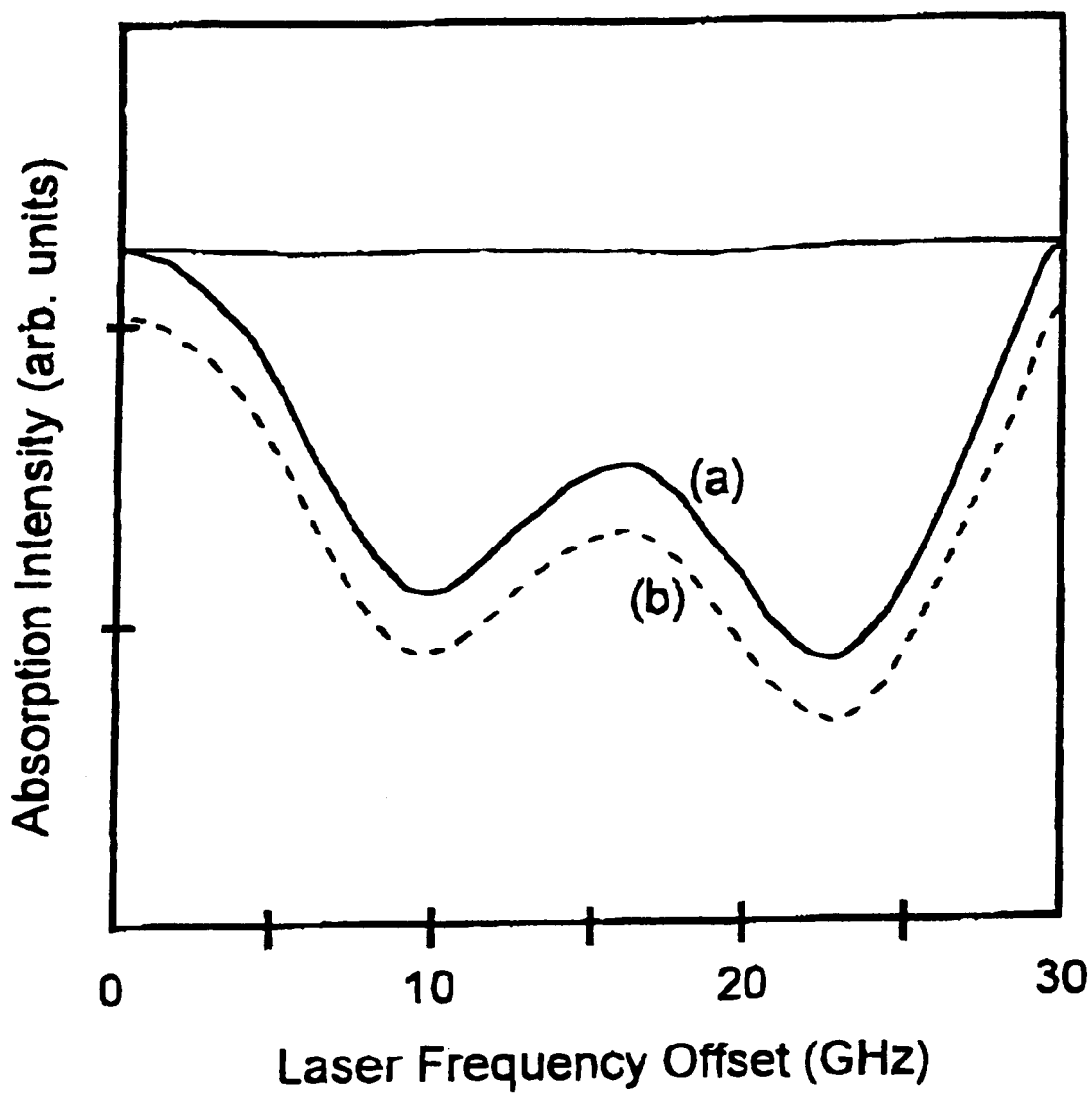
FIG. 6 is a graphical representation of two power-gated holes burned in the ZPL (zero phonon line) of MgS:Eu: (a) and read immediately afterwards; (b) and detected after 2,000 cycles of reading.

With reference to FIG. 6, this graph is disclosed in FIG. 3 of Z. Hasan et al., "Power-Gated Spectral Holeburning in an Unstable System (MgS:Eu2+,Eu3+): A Case for High Density Gated Holeburning," and illustrates the possibility of survival of holes after reading (2,000 cycles), according to this invention. The stability of the hole burning pattern in the presence of the reading beam is shown in FIG. 6. The two holes were burned in the ZPL of MgS:Eu and immediately read (trace (a)). Following that, the samples were scanned by the read beam two thousand times and the holeburning pattern was read again (trace (b)).

The two patterns are indistinguishable, and are shown slightly separated in FIG. 6 for illustrative purposes. The number of reading cycles was limited to 2,000 for demonstration purposes. In inventive principle, the holes can survive in excess of one million reading cycles if read with the same power, and even more reading cycles if read with lower power.

IV. Survival of the Spectral Holes at High Temperatures

The temperature of operation is around or below 15 degrees Kelvin. Attempts to increase the operational temperature while keeping the high density of holes are underway (FIG. 9 of Z. Hasan, "Material Challenges for Spectral Holeburning Memories"). As shown in FIG. 9 of Z. Hasan, "Material Challenges for Spectral Holeburning Memories," a high density of holes and fast burning times are possible only near 10 K.

V. Thermal Cycling of Holes

Cycling to much higher temperatures than 10 K or 15 K is possible for short durations. The spectral holes in MgS: Eu survive thermal cycling up to 170 K (FIG. 10 of Z. Hasan, "Material Challenges for Spectral Holeburning Memories"). FIG. 10(a) of Z. Hasan, "Material Challenges for Spectral Holeburning Memories," shows that, for cycling temperatures below 100 K, there is no decrease in the hole depth. FIG. 10(b) of Z. Hasan, "Material Challenges for Spectral Holeburning Memories," shows the result of cycling the holes to 170 K for a few minutes; almost 80% of the hole depths are still observable.

Figure 7:
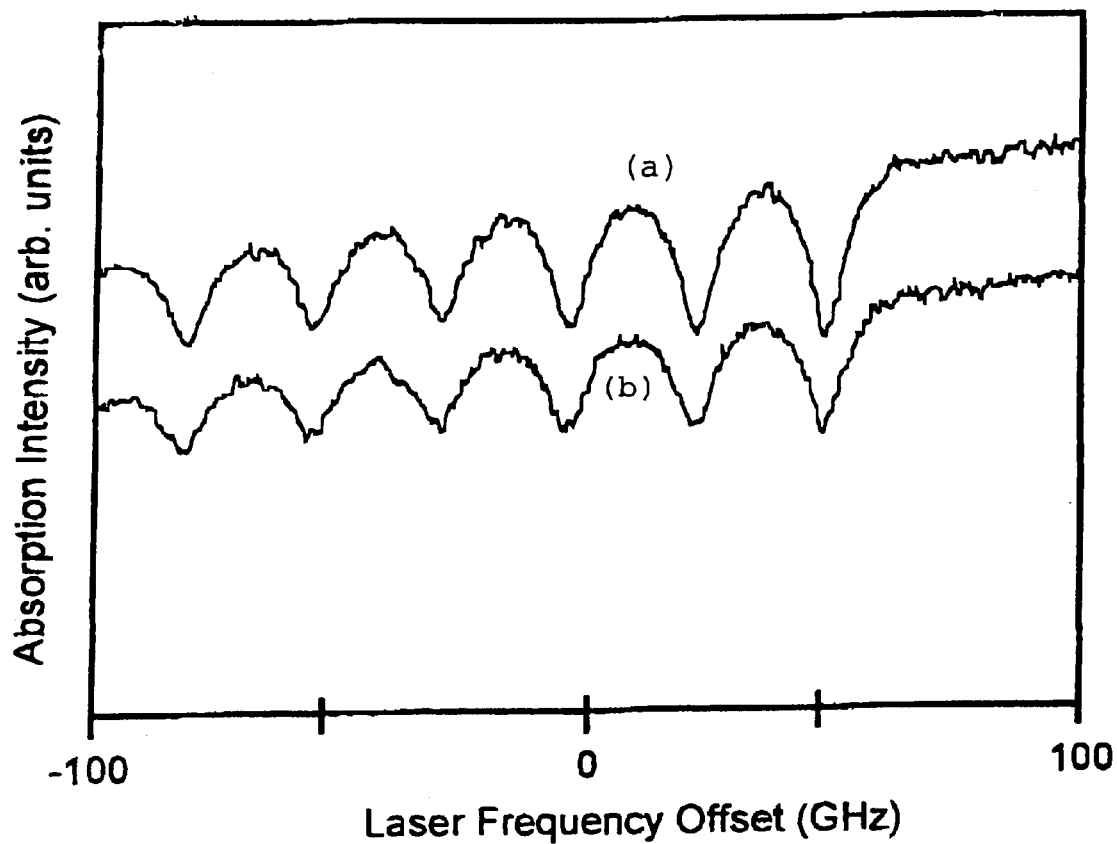
FIG. 7 is a graphical representation of six persistent holes burned at 2.2 degrees K in the ZPL (zero phonon line) of MgS:Eu: (a) and read immediately afterwards; (b) and read after thermally cycling to 170 degrees K.

With reference to FIG. 7, this graph is disclosed in FIG. 3 of Z. Hasan et al., "Power-Gated Spectral Holeburning in an Unstable System (MgS:Eu2+,Eu3+): A Case for High Density Gated Holeburning," and illustrates the possibility of survival of holes after thermal cycling (to 170 K), according to this invention. The persistence of holes at elevated temperatures was studied by burning the holes in the ZPL of MgS:Eu at low temperature, cycling them to higher temperatures, and then reading them at low temperature.

FIG. 7 shows six such holes which were burned and immediately read (trace (a)). The sample temperature was increased to 170 K and kept there for two minutes. The sample temperature was subsequently cooled down to 7 K, and the holes were read again (trace (b)). The hole depth and width remained unaltered up to 100 K. At higher temperatures a small change in hole depth as well as an increase in the hole width was observed. After the 150 K cycling, the hole depth was reduced to 78%. For the 300 K cycling, under the same conditions, the hole depth decreased to 23% of its original value. The hole width in this cycle increased by 80%.

VI. Fast Erasure of Spectral Holes

The spectral holes in MgS:Eu as well as CaS:Eu are completely photo-erasable (L. Biyikli et al., "High Density Photon-Gated Hole Burning in Sulfides"). This is done by shifting the frequency of the laser impinging on the sample to a higher value such that it falls in the range of the vibronic absorption of the medium.

VII. Survival of the Spectral Holes Over a Long Time Period

The spectral holes in our system survive indefinitely at or below 100 K (Z. Hasan et al., "Power-Gated Spectral Holeburning in an Unstable System (MgS:Eu2+,Eu3+): A Case for High Density Gated Holeburning"; see, also, discussion hereinabove regarding FIG. 7, wherein is noted that the depth of the holes and the width of the holes remained unaltered up to about one hundred K).

VIII. Suitability and Compatibility as a Device for Storage and Other Applications The inventors have studied II–VI compounds singly and doubly doped with rare earths and radiation-treated. These are in the form of micro-particles, and thin and thick films.

Best results for high density hole-burning are seen in micron sized samples. Attempts by the inventors to make a better medium by making nano-particles, thin films and superlattices of these systems are currently underway.

The present invention affords the highest number of persistent photon-gated holes, with the potential to increase the density further in different host and rare earth ion systems. Moreover, this invention demonstrates the fastest burning of photon-gated holes; a 10 nano-second duration has been demonstrated to be sufficient to burn a hole. This duration was limited by the laser used in the inventive experimentation, and can be reduced by one to two orders of magnitude, in inventive principle. Furthermore, in accordance with the present invention, the spectral holes can be cycled to temperatures up to 170K, with little loss in their depth. In addition, according to this invention, the spectral holes can be read thousands of time without significantly affecting their sharpness. Also, the electronic transition selected for burning is an electric dipole allowed; therefore, the holes can be burned very efficiently. It is noted that certain of the beneficial characteristics discussed herein, such as cycling to high temperatures and the survivability against reading, can be found in non-inventive materials, as well; however, the present invention uniquely combines all of these beneficial characteristics in a single system, such as MgS:Eu.

Other embodiments of this invention will be apparent to those skilled in the art from a consideration of this disclosure or practice of the invention disclosed herein. Various omissions, modifications and changes to the principles described may be made by one skilled in the art without departing from the true scope and spirit of the invention.

What is claimed is:

1. A medium for information storage, said medium comprising a polycrystalline composition which includes one II–VI compound and one rare earth element with which said II–VI compound is doped, said rare earth element being characterized by two different valence states, said composition having a plurality of persistent spectral holes, wherein said composition has the formula II–VI:$R_{v1}R_{v2}$, wherein II–VI represents said II–VI compound, wherein $R_{v1}$ represents said rare earth element characterized by a first said valence state, and wherein $R_{v2}$ represents said rare earth element characterized by a second said valence state which differs from said first said valence state.

2. The medium as in claim 1, wherein said second valence state is higher than said first valence state, and wherein the ratio of the number of $R_{v2}$ atoms to the number of $R_{v1}$ atoms is in the range between about 2 and about 10.

3. The medium as in claim 1, wherein said composition is MgS:Eu2+, Eu3+.

4. The medium as in claim 1, wherein said composition is CaS:Eu2+, Eu3+.

5. The medium as in claim 1, wherein:
said two different valence states are a lower valence state and a higher valence state;
a first group of atoms of said rare earth element has said lower valence state;
a second group of atoms of said rare earth element has said higher valence state;, and
there are more atoms in said second group of atoms than there are atoms in said first group of atoms.

6. The medium as in claim 1, wherein:
said two different valence states are a lower valence state and a higher valence state;
a first group of atoms of said rare earth element has said lower valence state;
a second group of atoms of said rare earth element has said higher valence state; and
there are at least twice as many atoms in said second group of atoms as there are atoms in said first group of atoms.

7. The medium as in claim 1, wherein:
said two different valence states are a lower valence state and a higher valence state;
a first group of atoms of said rare earth element has said lower valence state;
a second group of atoms of said rare earth element has said higher valence state; and
the ratio of the number of atoms in said second group of atoms to the number of atoms in said first group of atoms is in the range between approximately two and approximately ten.

8. A medium for information storage, said medium comprising a polycrystalline composition which includes one II–VI compound and two rare earth elements with which said II–VI compound is doped, said two rare earth elements being characterized by two different valence states, said composition having a plurality of persistent spectral holes, wherein said composition has the formula CaS:Eu2+,Sm3+, wherein CaS represents said II–VI compound, wherein Eu2+ represents a first said rare earth element characterized by a first said valence state, and wherein Sm3+ represents a second said rare earth element characterized by a second said valence state which differs from said first said valence state.

* * * * *